United States Patent
Yamamoto et al.

[11] Patent Number: 5,889,406
[45] Date of Patent: Mar. 30, 1999

[54] INDUCTANCE-CHANGE DETECTION APPARATUS

[75] Inventors: Masahiro Yamamoto; Yukio Yasuda, both of Tokyo, Japan

[73] Assignee: Mitsubishi Denki Kabushiki Kaisha, Tokyo, Japan

[21] Appl. No.: 949,623

[22] Filed: Oct. 14, 1997

[30] Foreign Application Priority Data

Apr. 18, 1997 [JP] Japan .................................. 9-101544

[51] Int. Cl.⁶ .................................................. G01R 27/28
[52] U.S. Cl. ........................ 324/657; 324/656; 361/188; 361/159
[58] Field of Search ..................... 324/656, 657, 324/654, 725, 610; 361/188, 159

[56] References Cited

U.S. PATENT DOCUMENTS 5,295,038  3/1994  Matsushita et al. .
5,608,318  3/1997  Yasui .............................. 324/656

FOREIGN PATENT DOCUMENTS

A-3 282020  12/1991  Japan .
A-4 204319   7/1992  Japan .
A-8 105464   4/1996  Japan .

*Primary Examiner*—Josie Ballato
*Assistant Examiner*—Jose M. Solis

[57] ABSTRACT

The inductance-change detection apparatus comprises an inductance-change converter that converts inductance-change in coils into voltage to output, a reference-voltage generator that generates and outputs a predetermined reference voltage, a frequency characteristic adder that adds a frequency characteristic similar to that of the converted voltage converted by the inductance-change converter to the reference voltage, a reference-voltage compensator that varies and compensates the frequency spectrum of the reference voltage containing the added frequency characteristic, in parallel in the direction of amplitude, corresponding to a parallel variation of the frequency spectrum of the converted voltage in the direction of amplitude, and an inductance-change detector that compares the converted voltage with the compensated reference voltage to detect inductance changes in the coils.

5 Claims, 7 Drawing Sheets

INDUCTANCE-CHANGE DETECTION APPARATUS

BACKGROUND OF THE INVENTION

1. Field of the Invention

The present invention relates to inductance-change detection apparatus that detects inductance change in coils and more particularly a circuit that compensates inductance characteristics.

2. Description of the Related Art

FIG. 5 is a block circuit diagram that illustrates a prior inductance-change detection apparatus. Referring to FIG. 5, an inductance-change detection circuit 100 detects inductance change in coils L1, L2, where coils L1, L2 are connected in serial. The serial circuit is connected between the plus terminal of a DC power supply 101 and the ground. A resistor 102 is connected in parallel to coil L1. A resistor 103 is connected in parallel to coil L2. These resistors restrict the current flowing through coils L1, L2.

A serial circuit formed of resistors 104, 105 is connected in parallel to the serial circuit of coils L1, L2. The connection between coils L1 and L2 is connected to the inverting input terminal of a differential amplifier 107 through a high-pass filter 106. The connection between resistors 104 and 105 is connected to the non-inverting input terminal of differential amplifier 107 through a high-pass filter 108. The output of the differential amplifier 107 is applied to an inductance-change detector 109. The output of inductance-change detector 109 is the output of inductance-detection apparatus 100. Inductance-change detector 109 detects the inductance change in coils L1, L2 based on the output signal of differential amplifier 107.

Unnecessary low-frequency signals of the coil-voltage-divided voltage VL output from the connection between coils L1 and L2 are attenuated by high-pass filter 106. Then the output of high-pass filter 106 is applied to the inverting input terminal of differential amplifier 107. On the other hand, unnecessary low-frequency signals of a reference voltage $V_{ref}$ output from the connection between resistors 104 and 105 are attenuated by high-pass filter 108. Then the output of high-pass filter 108 is applied to the non-inverting input of differential amplifier 107. Differential amplifier 107 amplifies and outputs the difference signal between the coil-voltage-divided voltage VL applied to its inverting input and the reference voltage $V_{ref}$ applied to its non-inverting input.

If, for example, the source voltage VB supplied from DC power supply 101 declines, so that a DC signal is superimposed on the coil-voltage-divided voltage VL and the reference voltage $V_{ref}$ then the DC signal is blocked by high-pass filters 106 and 108. Therefore, the DC signal does not affect the output of differential amplifier 107. However, the coil-voltage-divided voltage VL has a frequency characteristic, but the reference voltage $V_{ref}$ does not have a frequency characteristic. Therefore, if an AC signal is superimposed on the source voltage VB, then the output of differential amplifier 107 outputs a signal that indicates as if the inductance of coils L1, L2 has changed. As a result, inductance-change detector 109 wrongly detects inductance change in coils L1, L2.

FIG. 6 illustrates frequency spectra that show the frequency characteristics of coil-voltage-divided voltage VL and the reference voltage $V_{ref}$. It is seen from FIG. 6 that the reference voltage does not have a frequency characteristic, but the coil-voltage-divided voltage VL has a frequency characteristic.

Therefore, in order to make the reference voltage $V_{ref}$ have a frequency characteristic similar to that of the coil-voltage-divided voltage VL, an inductance-change detection apparatus 110 as shown in FIG. 7 has been devised. FIG. 7 differs from FIG. 5 in that a CR circuit 111 is connected in parallel to resistor 105 so that the reference voltage $V_{ref}$ should have a frequency characteristic similar to that of the coil-voltage-divided voltage VL. By this means, the frequency characteristics of the coil-voltage-divided voltage VL and the reference voltage $V_{ref}$ become frequency spectra as shown in FIG. 8. As a result, when the detection of inductance change in a low-frequency range is unnecessary, the wrong detection of inductance change in a high-frequency range can be achieved in practice.

However, if the two coils L1 and L2 are placed under different temperature conditions, the frequency characteristic of the reference voltage $V_{ref}$ does not change, but the frequency characteristic of the coil-voltage-divided voltage VL changes, as illustrated by the frequency spectra of FIG. 9. Therefore, although changes in the coil-voltage-divided VL due to changes in the source voltage VB caused by noise in the power supply can be cancelled out under normal temperature, the coil-voltage-divided voltage VL cannot be cancelled out under low temperature or high temperature. As a result, even if there is no change in the inductance of coils L1, L2, a signal that indicates as if inductance change has occurred is output from differential amplifier 107. Therefore, inductance-change detector 109 wrongly detects inductance changes in coils L1, L2.

SUMMARY OF THE INVENTION

An essential object of the present invention is therefore to solve the above problem and to obtain an inductance-change detection apparatus that does not wrongly detect inductance change in coils under noise, temperature change, and the like.

In order to achieve the aforementioned objective, according to the present invention, there is provided an inductance-change detection apparatus for detecting inductance changes in coils, comprising an inductance-change converter that converts inductance-change in coils into voltage to output, a reference-voltage generator that generates and outputs a predetermined reference voltage, a frequency characteristic adder that adds a frequency characteristic similar to that of the converted voltage converted by the inductance-change converter to the reference voltage output from the reference-voltage generator, a reference-voltage compensator that varies and compensates the frequency spectrum of the reference voltage containing the added frequency characteristic, in parallel in the direction of amplitude, corresponding to a parallel variation of the frequency spectrum of the converted voltage in the direction of amplitude, and an inductance-change detector that compares the converted voltage converted by the inductance-change converter with the reference voltage compensated by the reference-voltage compensator to detect inductance change in the coils.

According to one aspect of the present invention, the reference-voltage compensator comprises a voltage divider that divides the source voltage into a predetermined voltage to output, a voltage-difference detector that detects the voltage difference between the converted voltage converted by the inductance-change converter and the divided voltage divided by the voltage-divider, and a compensator that varies the divided voltage and the reference voltage generated by the reference-voltage generator, depending on the voltage difference detected by the voltage-difference detector, to compensate the reference voltage.

According to another aspect of the present invention, the voltage-difference detector has an instrumentation amplifier that amplifies the difference between the converted voltage converted by the inductance-change converter and the divided voltage divided by the voltage divider and a low-pass filter that is connected to the output terminal of the instrumentation amplifier.

According to a further aspect of the present invention, the compensator varies the divided voltage the same as the variation of the converted voltage and varies the reference voltage at a predetermined rate.

BRIEF DESCRIPTION OF THE DRAWINGS

These and other objects and features of the present invention will become clear from the following description taken in conjunction with the preferred embodiment thereof and the accompanying drawings throughout which like parts are designated by like reference numerals, and in which.

DETAILED DESCRIPTION OF THE PREFERRED EMBODIMENTS

The preferred embodiments according to the present invention will be described below in conjunction with the attached drawings.

Figure 1:
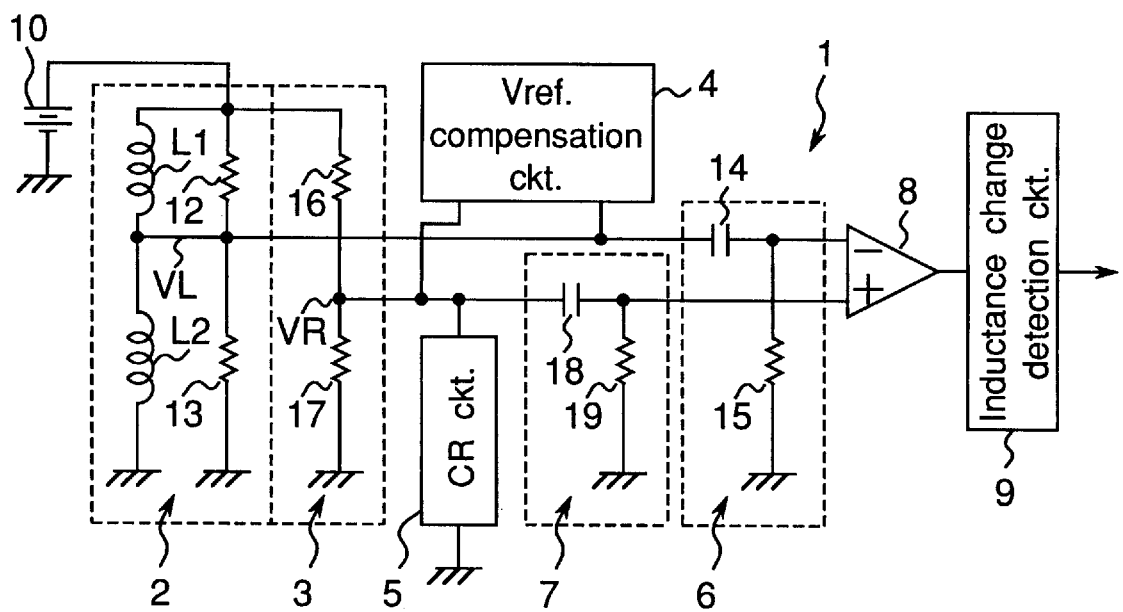
FIG. 1 is a block circuit diagram illustrating an example of inductance-change detection apparatus in a first embodiment of the present invention.
Figure 2:
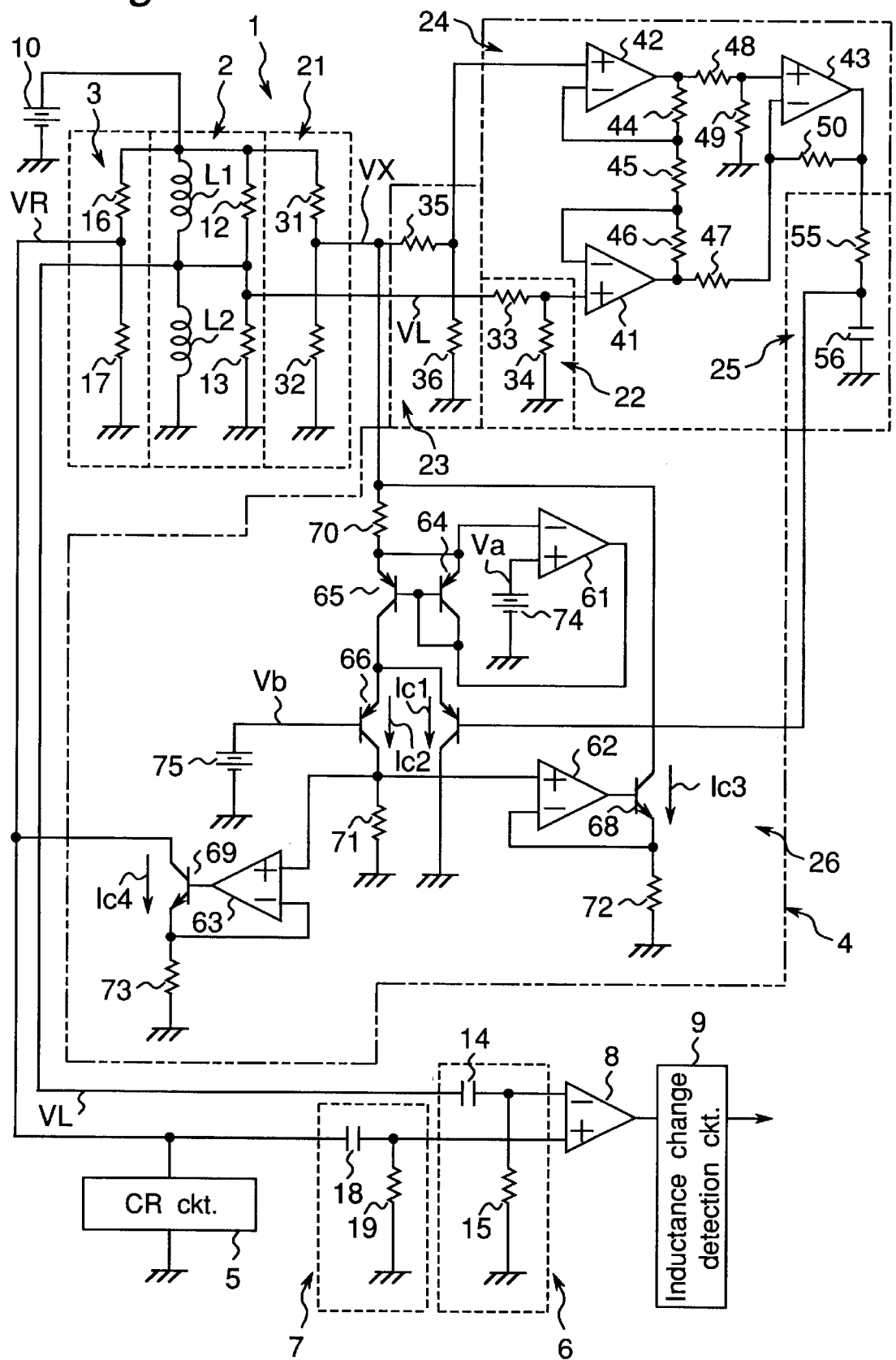
FIG. 2 is a circuit diagram illustrating an example of inductance-change detection apparatus in the first embodiment.

FIG. 1 is a block circuit diagram illustrating an example of inductance-change detection apparatus in a first embodiment of the present invention. FIG. 2 is a circuit diagram illustrating an example of inductance-change detection apparatus in the first embodiment. Referring to FIGS. 1 and 2, an inductance-change detection apparatus 1 comprises an inductance-change conversion circuit 2, a reference-voltage generation circuit 3, a reference-voltage compensation circuit 4, a CR circuit 5, high-pass filters 6, 7, a differential amplifier 8, an inductance-change detection circuit 9, and a DC power supply 10. Inductance-change conversion circuit 2 constitutes an inductance-change converter; reference-voltage generation circuit 3 constitutes a reference-voltage generator; reference-voltage compensation circuit 4 constitutes a reference-voltage compensator; CR circuit 5 constitutes a frequency-characteristic adder; high-pass filters 6, 7, differential amplifier 8, and inductance-change detection circuit 9 constitute an inductance-change detector.

Inductance-change conversion circuit 2 is a circuit that converts inductance-changes in coils L1, L2 into voltage changes to output. Inductance-change conversion circuit 2 is composed of coils L1, L2 and resistors 12, 13. Coils L1, L2 are connected in serial. This serial circuit is connected between the plus terminal of DC power supply 10 and the ground. Resistor 12 is connected in parallel to coil L1; resistor 13 is connected in parallel to coil L2. These resistors restrict the current flowing through coils L1, L2.

The connection between coils L1 and L2 is connected to the inverting input terminal of differential amplifier 8 through high-pass filter 6 composed of a capacitor 14 and a resistor 15. The connection between coils L1 and L2 outputs a coil-voltage-divided voltage VL. Reference-voltage generation circuit 3 is a circuit that generates a reference voltage VR. Reference-voltage generation circuit 3 is formed of a serial circuit composed of resistors 16, 17. This serial circuit is connected between the plus terminal of DC power supply 10 and the ground. The coil-voltage-divided voltage VL is a converted voltage that is obtained by converting inductance change in coils L1, L2.

The connection between resistors 16 and 17 is connected to the non-inverting input terminal of differential amplifier 8 through high-pass filter 7 composed of a capacitor 18 and a resistor 19. The connection between resistors 16 and 17 outputs the reference voltage VR. CR circuit 5 is connected in parallel to resistor 17. CR circuit 5 is formed so that the reference voltage VR should have a frequency characteristic similar to that of the coil-voltage-divided voltage VL. The output of differential amplifier 8 is applied to inductance-change detection circuit 9, whose output is the output of inductance-change detection apparatus 1. Inductance-change detection circuit 9 detects inductance change in coils L1, L2 based on the output signal of differential amplifier 8. Further, the connection between coils L1 and L2 and the connection between resistors 16 and 17 are applied to reference-voltage compensation circuit 4.

Reference-voltage compensation circuit 4 is formed of voltage-division circuits 21, 22, 23, an instrumentation amplifier 24, a low-pass filter 25, and a compensation circuit 26. The instrumentation amplifier is also called instrument amplifier or data amp, and called data amp 24 hereafter. Voltage-division circuit 21 constitutes a voltage divider; voltage-division circuits 22, 23, data amp 24, and low-pass filter 25 constitute a voltage-difference detector; and compensation circuit 26 constitutes a compensator.

Voltage-division circuit 21 is formed of a serial circuit composed of resistors 31, 32 that is connected in parallel to DC power supply 10. The connection between resistors 31 and 32 outputs a voltage-divided voltage VX. Voltage-division circuit 22 is formed of a serial circuit composed of resistors 33, 34 that is connected in parallel to resistor 13. Voltage-division circuit 23 is formed of a serial circuit composed of resistors 35, 36 that is connected in parallel to resistor 32. Here, resistors 33, . . . , 36 are high resistors so that they should not affect coils L1, L2, or resistors 31 and 32. Also, the reference voltage VR and the voltage-divided voltage VX are set to be equal in magnitude.

Data amp 24 is composed of operational amplifiers 41, 42, 43, and resistors 44, . . . , 50. Data amp 24 is a highperformance differential amplifier having a good common-mode rejection ratio (CMRR). The non-inverting input terminal of operational amplifier 41 is connected to the connection between resistors 33 and 34. The output of operational amplifier 41 is applied to its inverting input through resistor 46. The non-inverting input terminal of operational amplifier 42 is connected to the connection between resistors 35 and 36. The output of operational amplifier 42 is applied to its inverting input through resistor 44. A serial circuit composed of resistors 48, 49 is connected between the output terminal of operational amplifier 42 and the ground. The connection between resistors 48 and 49 is connected to the non-inverting input terminal of operational amplifier 43. The inverting input terminals of operational amplifiers 41 and 42 are connected to each other through resistor 45. The output of operational amplifier 43 is applied to its inverting input through resistor 50.

Low-pass filter 25 is composed of a resistor 55 and a capacitor 56. A serial circuit composed of resistor 55 and capacitor 56 is connected between the output terminal of operational amplifier 43 and the ground. The connection between resistor 55 and capacitor 56 outputs the output signal of low-pass filter 25.

Compensation circuit 26 is composed of operational amplifiers 61, 62, 63, PNP transistors 64, . . , 67, NPN transistors 68, 69, resistors 70, . . , 73, and DC power supplies 74, 75. In compensation circuit 26, PNP transistors 64, 65 form a current mirror circuit, where their emitters are connected to each other and connected to the inverting input terminal of operational amplifier 61 and at the same time connected to the connection between resistors 31 and 32 through resistor 70. The bases of PNP transistors 64, 65 are connected to each other and connected to the collector of PNP transistor 64. The collector of PNP transistor 64 is connected to the output terminal of operational amplifier 61. DC power supply 74 that generates a predetermined voltage Va is connected between the non-inverting input terminal of operational amplifier 61 and the ground.

The collector of PNP transistor 65 is connected to the emitters of PNP transistors 66, 67. DC power supply 75 that generates a predetermined voltage Vb is connected between the base of PNP transistor 66 and the ground. The collector of PNP transistor 66 is grounded through transistor 71 and at the same time connected to the non-inverting input terminal of operational amplifiers 62, 63. The base of PNP transistor 67 is connected to the connection between resistor 55 and capacitor 56 in low-pass filter 25. The collector of PNP transistor 67 is grounded.

The output of operational amplifier 62 is applied to the base of NPN transistor 68. The inverting input terminal of operational amplifier 62 is connected to the emitter of NPN transistor 68. The emitter of NPN transistor 68 is grounded through resistor 72. The collector of NPN transistor 68 is connected to the connection between resistors 31 and 32. The output of operational amplifier 63 is applied to the base of NPN transistor 69. The inverting input terminal of operational amplifier 63 is connected to the emitter of NPN transistor 69. The emitter of NPN transistor 69 is grounded through resistor 73. The collector of NPN transistor 69 is connected to the connection between resistors 16 and 17.

In the above construction, after unnecessary low-frequency signals are attenuated by high-pass filter 6, the coil-voltage-divided voltage VL output from the connection between coils L1 and L2 is applied to the inverting input of differential amplifier 8. On the other hand, the reference voltage VR output from the connection between resistors 16 and 17 has a frequency characteristic similar to the coil-voltage-divided voltage VL by means of CR circuit 5. After unnecessary low-frequency signals are attenuated by high-pass filter 7, the coil-voltage-divided voltage VL is applied to the non-inverting input of differential amplifier 8. Differential amplifier 8 amplifies the difference signal of the coil-voltage-divided voltage VL applied to the inverting input and the reference voltage VR applied to the non-inverting input. Inductance-change detection circuit 9 detects inductance changes in coils L1, L2 from the output signal of differential amplifier 8.

Here, if surrounding temperature declines, so that the impedance of coil L1 becomes smaller, then the coil-voltage-divided voltage VL rises. Then the voltage divided by voltage-division circuit 22 also rises, so that the electric potential at the non-inverting input of operational amplifier 41 also rises. This non-inverting input is the input of data amp 24. Therefore, the electric potential at the output of operational amplifier 43 decreases by negative feedback. This output is the output of data amp 24. Here, the change in the output voltage of operational amplifier 43 due to temperature change is a change of a DC signal, so that it is not attenuated by low-pass filter 25. Therefore, it is input to the base of NPN transistor 67 in compensation circuit 26, so that the base voltage declines. On the other hand, inductance change in coils L1, L2 and AC signals caused by noise in the power supply are attenuated by low-pass filter 25, so that they do not change the base voltage of NPN transistor 67.

As the base voltage of PNP transistor 67 declines, the collector current Ic1 of PNP transistor 67 increases. Here, the current flowing into the emitters of PNP transistors 66 and 67 is supplied from the current-mirror circuit formed of NPN transistors 64, 65. The emitter voltage of PNP transistors 64, 65 is kept constant by operational amplifier 61 at a predetermined voltage Va. Therefore, the current supplied from the collector of PNP transistor 65 is constant. Therefore, the collector current Ic2 of PNP transistor 66 decreases by the amount of increase in the collector current Ic1 of PNP transistor 67.

As the collector current Ic2 decreases, the electric potential at the non-inverting inputs of operational amplifier 62, 63 declines, so that the electric potential at the inverting inputs of operational amplifiers 62, 63 declines by an imaginary short-cut to become the same as the electric potential at the non-inverting inputs. The electric potential at the connection between the emitter of NPN transistor 68 and resistor 72 declines by the decline of the electric potential at the inverting input of operational amplifier 62. As a result, the current flowing through resistor 72, which is the collector current Ic3 of NPN transistor 68 decreases, so that the voltage-divided voltage VX rises. Similarly, the electric potential at the connection between the emitter of NPN transistor 69 and resistor 73 declines by the decline of the electric potential at the inverting input of operational amplifier 63. As a result, the current flowing through resistor 73, which is the collector current Ic4 of NPN transistor 69 decreases, so that the reference voltage VR rises.

On the other hand, the electric potential at the inverting input of operational amplifier 61 is going to rise, as the voltage-divided voltage VX rises. However, operational amplifier 61 draws current into its output terminal through PNP transistor 64 to keep the imaginary short-cut. Therefore, the electric potential at the inverting input becomes the electric potential at the non-inverting input, so that it is kept constant without a rise. Therefore, the voltage at the emitters of PNP transistors 64 and 65 are kept at a predetermined voltage Va.

The above operation continues, until the coil-voltage-divided voltage VL and the voltage-divided voltage VX become equal. When the coil-voltage-divided voltage VL and the voltage-divided voltage VX become equal, the rise of the voltage-divided voltage VX stops, and the rise of the reference voltage VR also stops. If the change in the reference voltage VR is equal to the change in the voltage-divided voltage VX, then only the DC signal of the amount of change in the coil-voltage-divided voltage VL is cancelled out, so that the frequency characteristic shifts by the AC signals of the amount of change.

However, the rate of change in the reference voltage VR corresponding to a change in the voltage-divided voltage VX can be freely set by the resistance values of resistors 72, 73. Therefore, the resistance values of resistors 72 and 73 are set so that the frequency characteristic of the reference voltage VR should agree with the frequency characteristic of the coil-voltage-divided voltage VL, by considering the shift between the DC signal of the change in the coil-voltage-divided voltage VL due to temperature change and the change in the frequency characteristic of inductance in coils L1, L2.

Figure 3:
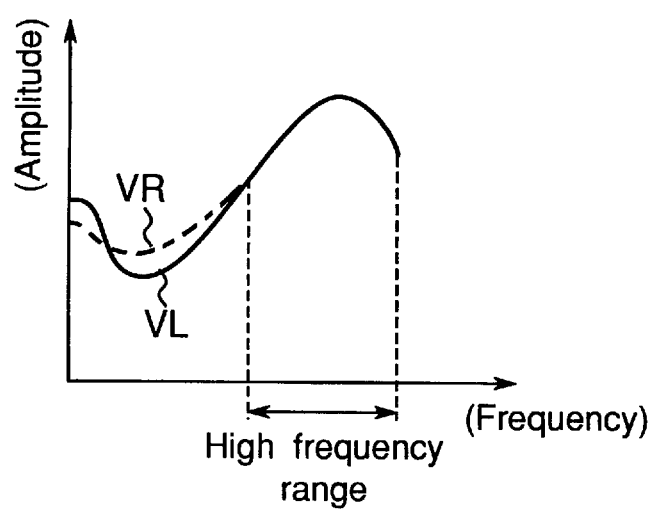
FIG. 3 is an illustration showing the frequency spectra of the coil-voltage-divided voltage VL and the reference voltage VR in the inductance-change detection apparatus of FIG. 2.

For example, suppose there is no need of detecting inductance change in coils L1, L2 on a low-frequency range. In this case, as shown in the frequency spectra of FIG. 3, the resistance values of resistors 72 and 73 are set so that the variation of the frequency characteristic of the coil-voltage-divided voltage VL should agree with the variation of the frequency characteristic of the reference voltage VR on a high-frequency range in which inductance change in coils L1, L2 is tested. In this case, the variation of the frequency characteristic of the coil-voltage-divided voltage VL may not agree with the variation of the frequency characteristic of the reference voltage VR on a low-frequency range, as shown in FIG. 3.

Figure 4:
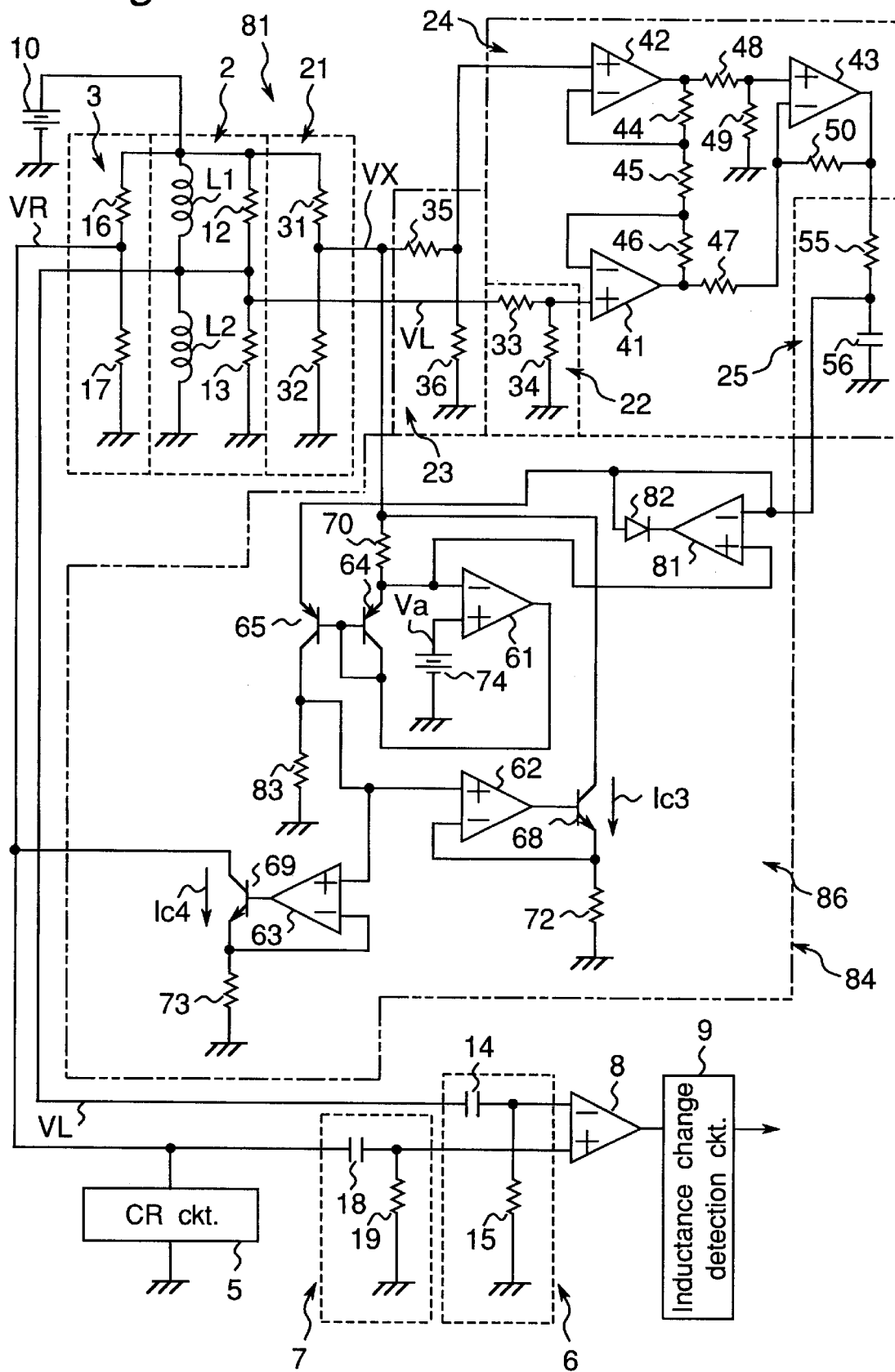
FIG. 4 is a circuit diagram illustrating another example of inductance-change detection apparatus in the first embodiment of the present invention.
Figure 5:
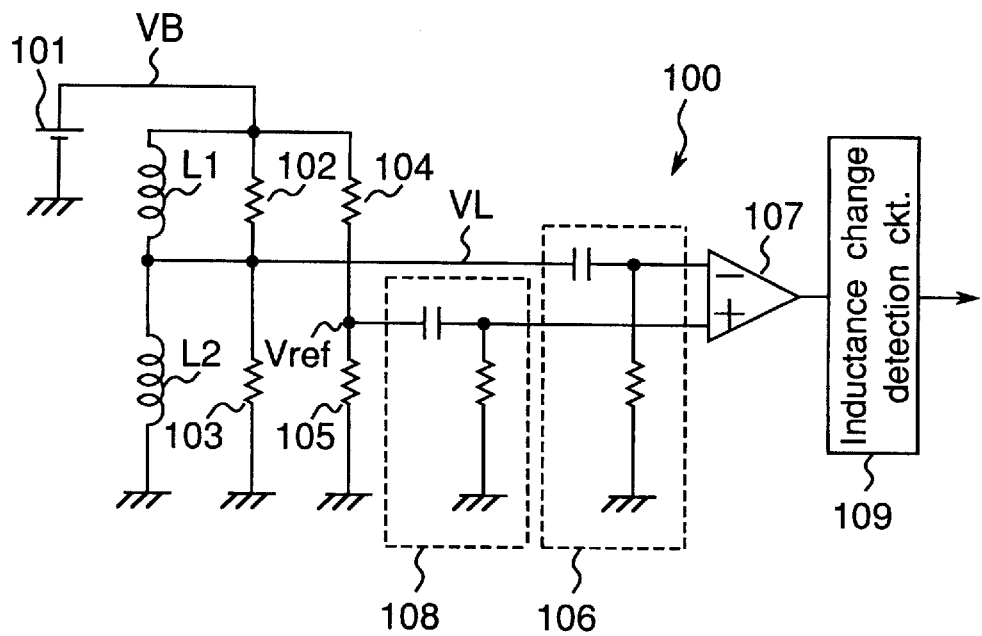
FIG. 5 is a block circuit diagram that illustrates a prior inductance-change detection apparatus.
Figure 6:
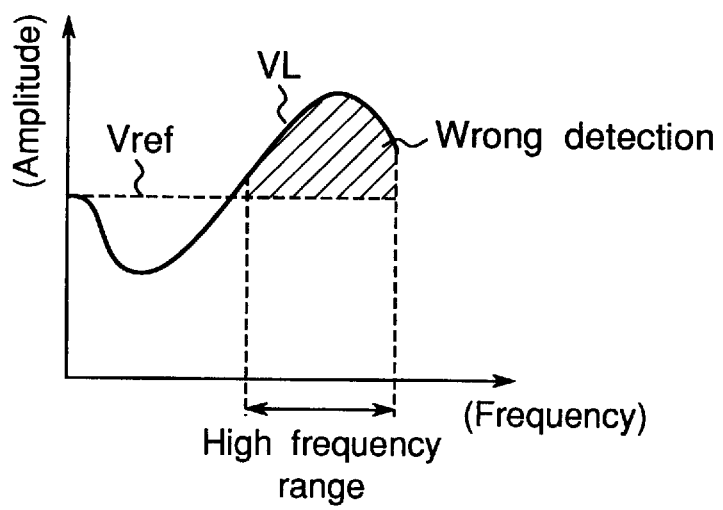
FIG. 6 is an illustration showing the frequency spectra of the coil-voltage-divided voltage VL and the reference voltage $V_{ref}$ in the inductance-change detection apparatus of FIG. 5.
Figure 7:
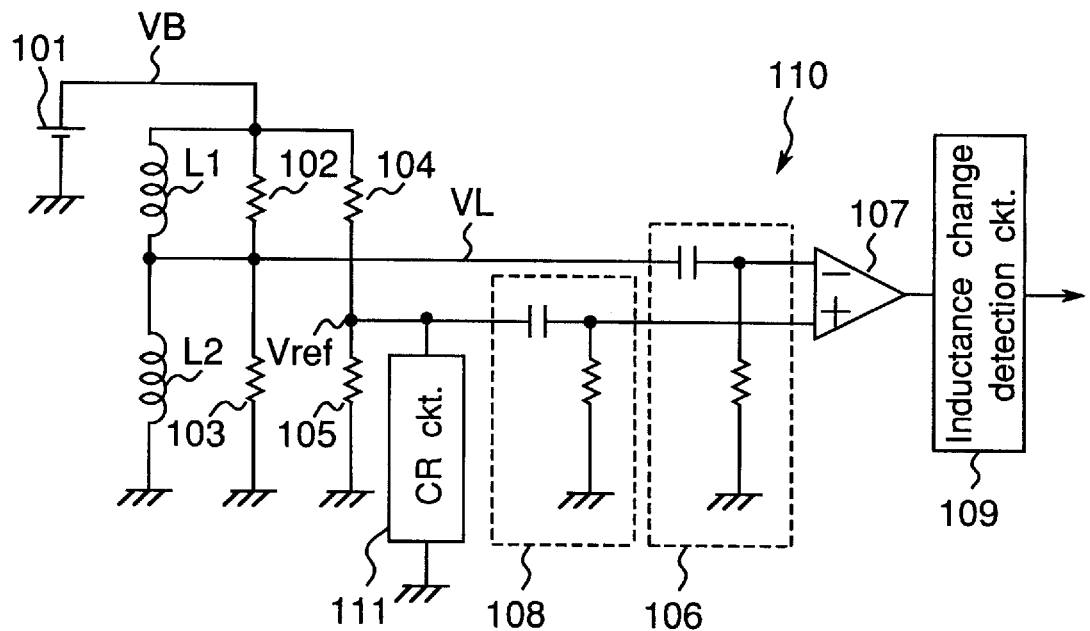
FIG. 7 is a block circuit diagram illustrating another example of prior inductance-change detection apparatus.
Figure 8:
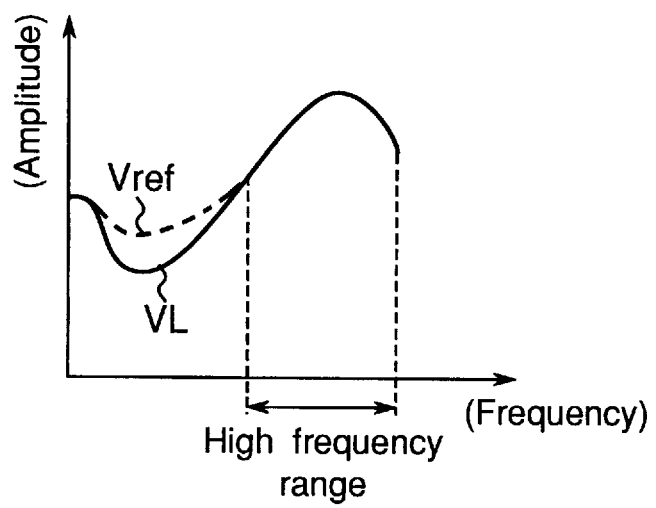
FIG. 8 is an illustration showing the frequency spectra of the coil-voltage-divided voltage VL and the reference voltage $V_{ref}$ in the inductance-change detection apparatus of FIG. 7.
Figure 9:
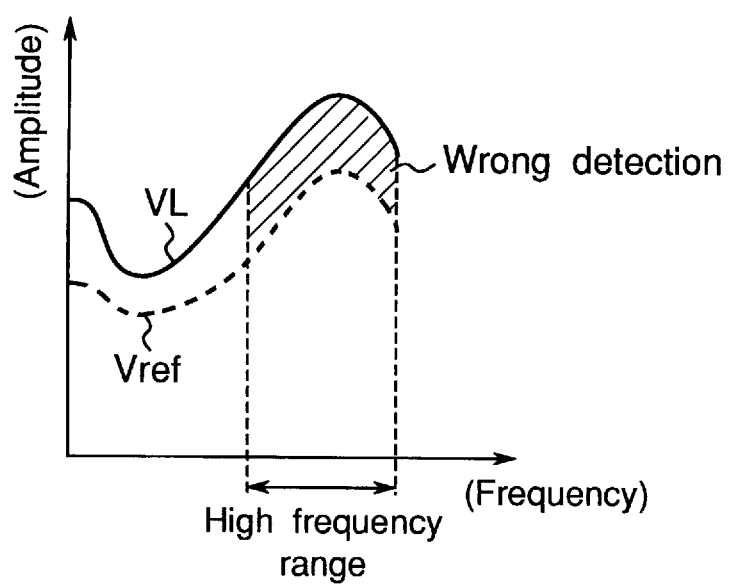
FIG. 9 is an illustration showing the frequency spectra of the coil-voltage-divided voltage VL and the reference voltage $V_{ref}$ in the case where coils L1 and L2 are placed under different temperature conditions.

Next, FIG. 4 is a circuit diagram illustrating another example of inductance-change detection apparatus in the first embodiment of the present invention. In FIG. 4, the same components as in FIG. 1 or 2 are denoted by the same reference numerals, and their descriptions are omitted from here. Only those points different from FIG. 1 or 2 are described in the following.

FIG. 4 differs from FIG. 1 or 2 in that the circuitry of the compensation circuit 26 is changed. Therefore, the compensation circuit 26 of FIG. 2 is changed into a compensation circuit 86. With this change, the reference-voltage compensation circuit 4 of FIG. 1 is changed into a reference-voltage compensation circuit 84. The inductance-change detection apparatus 1 of FIGS. 1 and 2 is changed into an inductance-change detection apparatus 81. A block diagram of inductance-change detection apparatus 81 is the same as FIG. 1 except the reference-voltage compensation circuit 4 being replaced with reference-voltage compensation circuit 84, so that the block diagram is omitted from here.

Referring to FIG. 4, inductance-change detection apparatus 81 comprises an inductance-change conversion circuit 2, a reference-voltage generation circuit 3, a reference-voltage compensation circuit 84, a CR circuit 5, high-pass filters 6, 7, a differential amplifier 8, an inductance-change detection circuit 9, and a DC power supply 10. Reference-voltage compensation circuit 84 is formed of voltage-division circuits 21, 22, 23, a data amp 24, a low-pass filter 25, and a compensation circuit 86. Reference-voltage compensation circuit 84 constitutes a reference-voltage compensator; compensation circuit 86 constitutes a compensator.

Compensation circuit 86 is composed of operational amplifiers 61, 62, 63, 81, a diode 82, PNP transistors 64, 65, NPN transistors 68, 69, resistors 70, 72, 73, 83 and a DC power supply 74. In compensation circuit 86, the emitter of PNP transistor 64 is connected to the inverting input terminal of operational amplifier 61 and at the same time connected to the connection between resistors 31 and 32 through resistor 70. The bases of PNP transistors 64, 65 are connected to each other and connected to the collector of PNP transistor 64. The collector of PNP transistor 64 is connected to the output terminal of operational amplifier 61. DC power supply 74 that generates a predetermined voltage Va is connected between the non-inverting input terminal of operational amplifier 61 and the ground.

Operational amplifier 81 and diode 82 constitutes a current-restriction circuit. The output of operational amplifier 81 is applied to its inverting input through diode 82. The non-inverting input terminal of operational amplifier is connected to the inverting input terminal of operational amplifier 61. The connection between the inverting input terminal of operational amplifier 81 and the anode of diode 82 is connected to the emitter of PNP transistor 65 and to the connection between resistor 55 in low-pass filter 25 and capacitor 56. The collector of PNP transistor 65 is grounded through resistor 83 and also connected to the non-inverting input terminals of operational amplifiers 62 and 63.

The output of operational amplifier 62 is applied to the base of NPN transistor 68. The inverting input terminal of operational amplifier 62 is connected to the emitter of NPN transistor 68. The emitter of NPN transistor 68 is grounded through resistor 72. The collector of NPN transistor 68 is connected to the connection between resistors 31 and 32. The output of operational amplifier 63 is applied to the base of NPN transistor 69. The inverting input terminal of operational amplifier 63 is connected to the emitter of NPN transistor 69. The emitter of NPN transistor 69 is grounded through resistor 73. The collector of NPN transistor 69 is connected to the connection between resistors 16 and 17.

In the above construction, if surrounding temperature declines, so that the impedance of coil L1 becomes smaller, then the coil-voltage-divided voltage VL rises. Then the voltage divided by voltage-division circuit 22 also rises, so that the electric potential at the non-inverting input of operational amplifier 41 rises. This non-inverting input is the input of data amp 24. Therefore, the electric potential at the output of operational amplifier 43 decreases by negative feedback. This output is the output of data amp 24. Here, the change in the output voltage of operational amplifier 43 due to temperature change is a change of a DC signal, so that it is not attenuated by low-pass filter 25. Therefore, it is input to the emitter of NPN transistor 65 in compensation circuit 86, so that the voltage between the base and emitter of PNP transistor 65 becomes small.

As the voltage between its base and emitter becomes small, the collector current Ic5 of PNP transistor 65 decreases. Therefore, the current flowing into resistor 83 decreases, so that the electric potential at the non-inverting inputs of operational amplifiers 62, 63 declines. Further, the electric potential at the inverting inputs of operational amplifiers 62, 63 declines by an imaginary short-cut to become the same as the electric potential at the non-inverting inputs. Therefore, the electric potential at the connection between the emitter of NPN transistor 68 and resistor 72 declines. As a result, the current flowing through resistor 72, which is the collector current Ic3 of NPN transistor 68, decreases, so that the voltage-divided voltage VX rises. Similarly, the electric potential at the connection between the emitter of NPN transistor 69 and resistor 73 declines by the decline of the electric potential at the inverting input of operational amplifier 63. As a result, the current flowing through resistor 73, which is the collector current Ic4 of NPN transistor 69, decreases, so that the reference voltage VR rises.

On the other hand, the non-inverting input of operational amplifier 81 is applied to the inverting input of operational amplifier 61, where the voltage of the inverting input of operational amplifier 61 is restricted at a predetermined voltage Va by an imaginary short-cut. Further, the inverting input of operational amplifier 81 is restricted at the same electric potential as its non-inverting input by an imaginary short-cut, so that the voltage between the base and the emitter of PNP transistor 65 is restricted at the predetermined voltage Va. As a result, the collector current Ic5 of PNP transistor 65 can be restricted by the predetermined voltage Va. Therefore, an excessive collector current Ic5 of PNP transistor 65 can be prevented from flowing through resistor 83, so that the collector voltage of PNP transistor 65 can be prevented from rising too much to cause saturation.

In this way, as in the inductance-change detection apparatus 1 of FIG. 1, the rate of change in the reference voltage VR corresponding to a change in the voltage-divided voltage VX can be freely set by varying the ratio of the resistance values of resistors 72, 73. Therefore, as in the inductance-change detection apparatus 1 of FIG. 1, the resistance values of resistors 72 and 73 are set so that the frequency characteristic of the reference voltage VR should agree with the frequency characteristic of the coil-voltage-divided voltage VL, by considering the shift between the DC signal of the change in the coil-voltage-divided voltage due to temperature change and the change in the frequency characteristic of inductance in coils L1, L2.

As described above, the inductance-change detection apparatus in the first embodiment of the present invention can freely set the rate of change in the reference voltage corresponding to the change in coil-voltage-divided voltage VL by varying the ratios of resistance values of resistors 72 and 73. The frequency spectrum of the reference voltage can be freely varied in parallel in the direction of amplitude, corresponding to a parallel variation of the frequency spectrum of the coil-voltage-divided voltage VL in the direction of amplitude caused by temperature change and the like. Therefore, the frequency spectra of the coil-voltage-divided voltage VL and the reference voltage VR can be made to agree with each other on a desired frequency range. As a result, inductance change on a predetermined frequency range can be accurately detected without errors due to noise in the power supply, temperature change, and the like, so that the accuracy in inductance-change detection can be improved.

Although the present invention has been fully described in connection with the preferred embodiment thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An inductance-change detection apparatus for detecting inductance changes in coils comprising:

an inductance-change converter that converts inductance changes in coils into voltages to output; a reference-voltage generator that generates and outputs a predetermined reference voltage; a frequency characteristic adder that adds a frequency characteristic similar to that of the converted voltage converted by said inductance-change converter to the reference voltage output from said reference-voltage generator; a reference-voltage compensator that varies and compensates the frequency spectrum of the reference voltage containing the added frequency characteristic, in parallel in the direction of amplitude, corresponding to a parallel variation of the frequency spectrum of the converted voltage converted by said inductance-change converter in the direction of amplitude; and an inductance-change detector that compares the converted voltage converted by said inductance-change converter with the reference voltage compensated by said reference-voltage compensator to detect inductance changes in said coils.

2. The inductance-change detection apparatus defined in claim 1, wherein said reference-voltage compensator comprises a voltage divider that divides the source voltage into a predetermined voltage to output, a voltage-difference detector that detects the voltage difference between the converted voltage converted by said inductance-change converter and the divided voltage divided by said voltage-divider, and a compensator that varies said divided voltage and the reference voltage generated by said reference-voltage generator, depending on the voltage difference detected by said voltage-difference detector, to compensate the reference voltage.

3. The induction-change detection apparatus defined in claim 2, wherein said compensator varies said divided voltage in a manner the same as the variation of said converted voltage and varies said reference voltage at a predetermined rate.

4. The inductance-change detection apparatus defined in claim 2, wherein said voltage-difference detector has an instrumentation amplifier that amplifies the difference between the converted voltage converted by said inductance-change converter and the divided voltage divided by said voltage divider and a low-pass filter that is connected to the output terminal of said instrumentation amplifier.

5. The induction-change detection apparatus defined in claim 4, wherein said compensator varies said divided voltage in a manner the same as the variation of said converted voltage and varies said reference voltage at a predetermined rate.

* * * * *